US008132761B2

United States Patent
Gruber et al.

(10) Patent No.: US 8,132,761 B2
(45) Date of Patent: Mar. 13, 2012

(54) ROBUST CAPACITIVE DISTANCE SENSOR

(75) Inventors: Robin Gruber, München (DE); Andreas Baumann, Schwarzenfeld (DE)

(73) Assignee: Deutsches Zentrum Fuer Luft-und Raumfahrt E.V., Cologne, DE (US)

( * ) Notice: Subject to any disclaimer, the term of this patent is extended or adjusted under 35 U.S.C. 154(b) by 102 days.

(21) Appl. No.: 12/667,965

(22) PCT Filed: May 29, 2008

(86) PCT No.: PCT/EP2008/056632
§ 371 (c)(1),
(2), (4) Date: Jan. 21, 2010

(87) PCT Pub. No.: WO2009/007176
PCT Pub. Date: Jan. 15, 2009

(65) Prior Publication Data
US 2011/0042522 A1 Feb. 24, 2011

(30) Foreign Application Priority Data
Jul. 6, 2007 (DE) .......................... 10 2007 031 547

(51) Int. Cl.
*B64G 1/64* (2006.01)
(52) U.S. Cl. .................. 244/172.5; 244/172.4; 244/171
(58) Field of Classification Search ............... 244/172.5, 244/172.4, 171; 324/660–662
See application file for complete search history.

(56) References Cited

U.S. PATENT DOCUMENTS

| 3,555,534 | A | | 1/1971 | Akers et al. |
| 5,394,292 | A | * | 2/1995 | Hayashida ..................... 361/179 |
| 5,729,133 | A | * | 3/1998 | Sakai et al. .................... 324/237 |
| 6,834,251 | B1 | * | 12/2004 | Fletcher ......................... 702/150 |
| 6,861,848 | B2 | * | 3/2005 | Kasai et al. .................... 324/661 |
| 6,866,232 | B1 | * | 3/2005 | Finney ......................... 244/172.4 |
| 6,969,030 | B1 | | 11/2005 | Jones et al. |
| 2005/0040282 | A1 | | 2/2005 | Wingo |
| 2009/0146012 | A1 | * | 6/2009 | Baumann ..................... 244/172.5 |
| 2010/0301169 | A1 | * | 12/2010 | Baumann et al. ........... 244/172.4 |

FOREIGN PATENT DOCUMENTS

| DE | 42 13 926 A1 | 11/1992 |
| GB | 2 296 972 A | 7/1996 |
| WO | 2004/054105 A2 | 6/2004 |
| WO | WO 2004054105 | * 6/2004 |

OTHER PUBLICATIONS

International Search Report dated Oct. 11, 2008 from corresponding international patent application No. PCT/EP2008/056632, 4 pages.
International Search Report dated Oct. 11, 2008 from corresponding international patent application No. PCT/EP2008/056632, 4 pages.

* cited by examiner

*Primary Examiner* — Timothy D Collins
*Assistant Examiner* — Jamie S Stehle
(74) *Attorney, Agent, or Firm* — Maier & Maier, PLLC

(57) ABSTRACT

The invention refers to a docking device for the docking of a maintenance device to a nozzle of a satellite, including a distance sensor for determining the distance between the maintenance device and the nozzle of the satellite. Further, a locking device is provided for connecting the docking device with the nozzle of the satellite.

26 Claims, 2 Drawing Sheets

ROBUST CAPACITIVE DISTANCE SENSOR

RELATED APPLICATIONS

This application claims priority, under 35 U.S.C. §119, to international patent application No.: PCT/EP2008/056632, filed on May 29, 2008, which claims priority to German patent application No.: 10 2007 031 547.5, filed Jul. 6, 2007, the disclosures of which are incorporated by reference herein in its entirety.

FIELD

The invention refers to a docking device for docking a maintenance device to a satellite.

BACKGROUND

In the operation of satellites, it is currently common practice that satellites, whose tank for position control is depleted, must be decommissioned. Moreover, defective satellites can neither be repaired nor can they be properly disposed of. In order to allow the maintenance of satellites, so-called "On Orbit Servicing" concepts are developed, within the scope of which maintenance work can be performed on defective satellite systems by means of special service satellites (so-called robonauts).

To be able to perform any kind of maintenance, for instance by means of a maintenance device described above, the maintenance device has to dock to the satellite to be maintained. However, present satellites are not designed for this purpose, because they have no standardized handles or hooks that would allow a stable contact with the maintenance device. As a consequence dysfunctional satellites cannot be maintained at all and must therefore be decommissioned.

It is an object of the invention to provide a device that allows for the maintenance of a satellite.

According to the invention, the object is achieved with the features of claim 1.

SUMMARY

A docking device is provided, for docking a maintenance device to a nozzle of a satellite. The nozzle of a satellite may be the apogee engine, for instance, i.e. the rocket engine that takes the satellite to its geostationary orbit and is no longer used thereafter.

According to the invention, a locking device is provided for the connection between the docking device and the nozzle of the satellite. In the present context, a locking device is a device that effects a rigid mechanical connection between the docking device and the nozzle of the satellite.

Locking the locking device prematurely or belatedly can result in an incorrect engagement with the nozzle of the satellite, whereby the docking becomes more difficult or is even prevented. Therefore, the invention further provides a distance sensor for determining the distance between the maintenance device and the satellite nozzle.

The use of a docking device for docking the maintenance device to a satellite nozzle also allows a docking of the maintenance device to satellites that have no special handles or hooks that would allow a stable contact with the maintenance device. In particular, the nozzle of the satellite is a component present in all satellites so that the docking device of the invention is suited for docking to many types of satellites.

The distance sensor is preferably configured as a capacitive distance sensor, wherein the capacitive distance sensor may comprise a plurality, especially three capacitive sensor modules. These may be mounted in particular in regular intervals on the outer side of an annular holder device. The holder device may especially be shaped as a circular ring, wherein preferably three capacitive sensor modules are provided that are mounted on the outer side of the annular holder device with a mutual offset of 120°.

In a preferred embodiment, the annular holder device is designed as an annular truncated cone. Here, the sensor modules may be arranged on the outer surface of the annular truncated cone's shell, especially under an acute angle with respect to the base surface of the truncated cone.

The environmental conditions prevailing in space impose dramatically higher demands on sensors than is true for terrestrial applications. For instance, great temperature variations, a high dose of radiation and, at least upon a contact between two satellites in orbit, a potential danger due to largely different voltage potentials have to be taken into account.

To counter these unfavorable environmental conditions, the capacitive distance sensor can be configured as described hereunder.

The capacitive distance sensor may comprise an oscillator that has a capacitive sensor module and an inductor that are connected to form an electric oscillating circuit. To avoid an attenuation of the electric oscillating circuit, an energy supply device, for instance in the form of a transistor, is further provided, via which electric energy is supplied to the electric oscillating circuit.

Preferably, the inductor has a primary winding and a secondary winding, the primary winding and the secondary winding being galvanically separated from each other. Thus, the capacitive sensor module is integrated in a transformer-like manner into the oscillator via the primary winding and the secondary winding. The secondary winding is electrically connected with the capacitive sensor module. Electric discharges that may occur upon a contact of the sensor module with an electrically charged object are thus blocked by this insulating barrier and, if need be, by a screen winding of the core. The screen winding prevents a common mode interference caused by an electrostatic discharge by dissipating the same to ground or to the housing.

Further, the configuration described above makes it possible to operate the capacitive sensor module at a clearly higher voltage than the oscillator circuit, if the secondary winding has more turns than the primary winding. On the one hand, this simplifies the use of capacitive high-frequency transistors, which thus only have a minor share in the overall capacity of the oscillating circuit and therefore have little influence on the sensitivity. On the other hand, the transformation ratio of the transformer increases the effective capacity of the sensor necessary for the oscillator circuit, so that even a sensor element of only a few Pico farad is still measurable and will not become small with respect to possible parasitic capacities of the oscillator circuit.

It is another advantage of this configuration that the capacitor plates of the sensor module are driven very symmetrically so that only a very limited emission of interfering radiation due to common mode interferences occurs. The field of two capacitor plates driven in an exactly inverse-phased manner is cancelled in the far zone as long as the frequency is low with respect to the dimensions of the plates. Otherwise, the same will function as a dipole and will emit an electromagnetic wave, which would undesirable. If, however, the driving of the plates includes a common-mode part, i.e. a (alternating) voltage difference exists between the average voltage of the capacitor plates and the housing of the arrangement, the housing of the arrangement acts as one pole of the dipole and the two capacitor plates act as the other pole. Thus, at the same operating frequency, the larger geometries involved alone cause a stronger emission of electromagnetic waves.

Further, for an optimization of the balancing, the secondary side of the inductor may comprise a centre tap that can be connected with a housing mass. Without a centre tap in the secondary winding, an asymmetry in the parasitic capacitance of the capacitor plates with respect to the housing can cause asymmetries in the capacitor plate voltage which then generates an increased interference radiation due to the common mode problem. If the centre tap is placed on the housing, the transformer-like coupling through the respectively equal number of turns ensures that one capacitor plate has exactly the inverse-phased voltage with exactly the same amplitude as the other plate has with respect to the housing.

It is particularly preferred for the oscillator to be configured as a Hartley oscillator.

In a preferred embodiment, the oscillator has a capacitance diode for tuning the oscillator. Here, the oscillator may be fed a temperature-dependent voltage via the capacitance diode, so that an additional detuning of the oscillator can be achieved in order to thus compensate for a temperature drift. Instead of using in parallel a tap existing anyway for the Hartley oscillator circuit at the coil, an additional dedicated coil for the detuning can be applied on the core. For a detuning of an oscillating circuit, capacitance diodes are often used. Mostly, these are further connected in parallel with the oscillating circuit capacitor via a further capacitor for insulating the direct voltage from the oscillating circuit, which direct voltage is used for detuning. The reference voltage is determined by the circuit topology of the oscillator and is not always optimal for feeding the control voltage.

Due to the good magnetic coupling of the windings of the coil used, it is of no importance whether an additional capacitance for detuning is connected directly to the oscillating circuit capacitor or whether it is coupled via an additional winding. In the latter case, there is the advantage of a free choice of the reference potential for the capacitance diode control voltage. In addition, the choice of the winding ratios of the additional coil with respect to the oscillating circuit coil allows setting the capacitance effective for the oscillating circuit, whereby the capacitance diode used can be adapted and utilized in an optimal manner.

This allows for a simpler ground reference for the capacitance diode and, because of the freely selectable number of turns, for an optimal adaptation to the capacitance range. Moreover, an amplifier element for the amplification of the oscillator output signal may be provided. This makes it possible to output the output signal via a line, while, at the same time, the capacitive load on the oscillating circuit is low. In the simplest case, a transistor connected as a voltage follower may be used.

To keep away external interferences, as well as interferences by the output amplifier, from the oscillator, two filters may be provided. These further prevent the high-frequency interferences that could be caused by the oscillator from being transmitted into the feed line.

For an optimum function of the circuit, even with sensor capacitances in the Pico farad range, special requirements exist for the coil. Since high oscillator frequencies prevail with small sensor capacitances, it is preferred that the core material of the coil is selected such that it has low magnetic reversal losses (e.g. K1 of EPCOS).

Since the coil is employed as an oscillating circuit inductor, it has to be able to store energy. Here, the inductor preferably has an air gap for storing magnetic energy. The same may be distributed over the core, however, it is preferably realized as a discrete gap in the magnetic path.

A material of high permeability may be well suited to concentrate magnetic field lines, as, for instance, in a ferrite core. However, due to the very strong hysteresis of the magnetizing, the energy supplied to a coil built with such a core would be used only for the magnetic reversal of the core material and only a small part thereof could be tapped. This would result in a poor quality. Pure air coils do not show this hysteresis since no material has to be magnetically reversed. Yet, they have a large stray field and only a clearly lower inductivity for the same amount of conductor material. In practice, therefore, most often a compromise is made for coils that are supposed to store energy, for instance coils for oscillating circuits, and a highly permeable core is provided with an air gap. This preserves the good concentration of the magnetic field lines, whereas the hysteresis is clearly reduced, so that the quality of a coil with an air gap is already clearly higher than without the same. However, the resulting slightly reduced overall permeability of the coil has to be compensated for by using more conductor material. Because of their material structure, special ferrite powder materials already comprise a plurality of small "air gaps" distributed over the core so that no dedicated gap is required.

Since the parasitic internal capacitance contributes to the effective oscillating circuit capacitance, it should be kept as low as possible. At the same time, the oscillator frequency must be kept as low as possible so as to minimize the interference radiation by the sensor plates. To achieve a low parasitic internal capacitance, a low number of turns is chosen. In order to achieve as high an inductivity of the coil as possible despite the low number of turns, it is preferred that the inductor has a pot core. Here, it is particularly preferred that the air gap is inside the core and stray magnetic fields outside the core are thereby minimized.

Since the coil is used as a transformer, a very good magnetic coupling between the primary winding and the secondary winding must be ensured in spite of the air gap. This can be achieved in particular by winding the primary winding and the secondary winding on the same coil body.

Thus, the features mentioned allow for a circuit of simple structure, which, for driving the capacitive sensor, comprises one or two transistors and, possibly, a capacitance diode as active components. Moreover, only few passive components are required, which allows for an assembly where space is limited, as well as for a radiation-resistant structure.

In a preferred embodiment, the sensor module has a sensing distance of more than 1 mm, so that it is possible to perform a locking by the locking device before the maintenance device drifts from a possible locking position after having abutted against the satellite. Thus, a possible drifting away of the satellite or the maintenance device can thus be prevented. Since very weak forces are used when the docking device enters the nozzle, it is important to use a contactless measuring system. Moreover, the sensor described offers the possibility to adjust the sensing distance that is determined by a processing electronics, and to thereby perform a posterior adaptation to different nozzle contours. An adaptation to different nozzle contours may also be effected alternatively or in addition by an adjustment of the angle of inclination of the capacitive sensor module used. The angle of inclination is the angle between the shell surface of the holder device and the base surface of the holder device.

BRIEF DESCRIPTION OF DRAWINGS

The following is an explanation of preferred embodiments of the invention with reference to the drawings. In the Figures.

DETAILED DESCRIPTION

Figure 1:
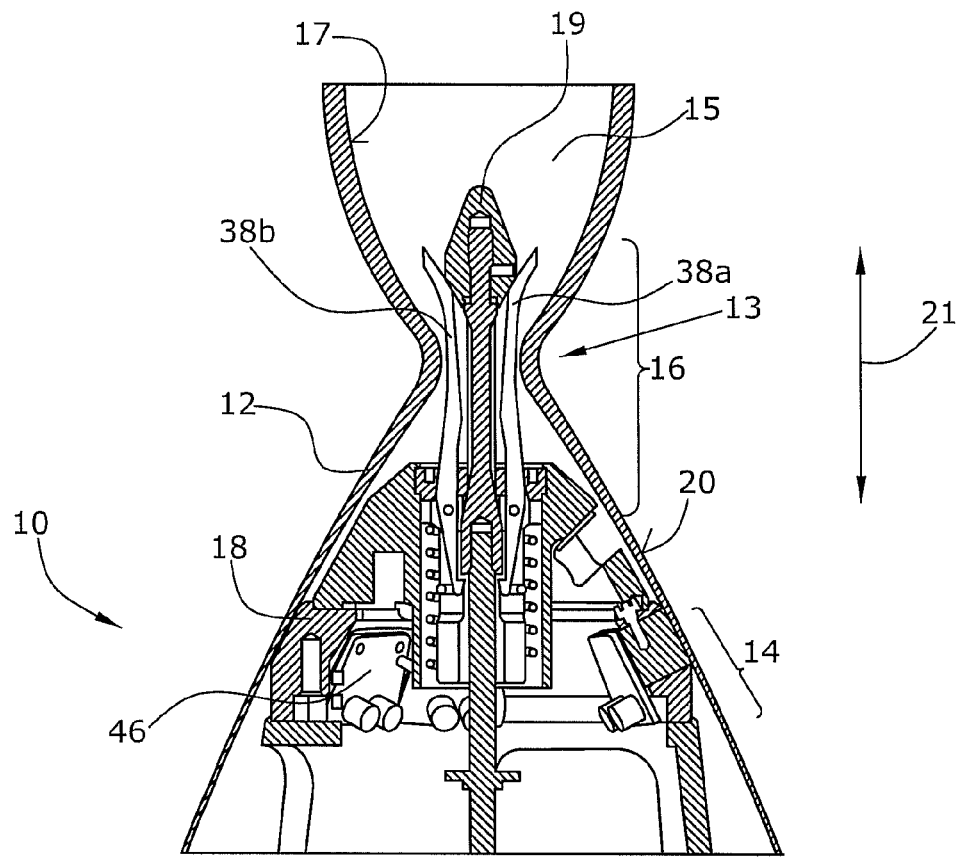
FIG. 1 is a schematic illustration of a docking device of the invention in the nozzle of a satellite.

According to FIG. 1, a docking device 10 for the docking of a maintenance device (not illustrated) to a nozzle 12 of a satellite comprises a distance sensor 14 for determining the distance between the maintenance device and the nozzle 12 of the satellite. Further, a locking device 16 for connecting the docking device 10 with the nozzle 12 of the satellite is provided.

Preferably, the locking device is configured such that it allows a locking of the docking device at a constriction 13 of the nozzle 12 of the satellite. For this purpose, the locking device 16 may, for instance, comprise two locking arms 38a, 38b to engage behind the constriction 13 of the nozzle 12. Further, a spreading device 15 may be provided for spreading the locking arms 38a, 38b apart. Preferably, the spreading device 15 is arranged between the locking arms 38a, 38b. It is particularly advantageous that the ends of the locking arms 38a, 38b averted from the docking device 10 are directed outward, i.e. towards the inner wall 17 of the nozzle 12, especially away from the spreading device 15. The locking arms 38a, 38b may be bent and/or kinked.

In order to spread the locking arms 38a, 38b, the spreading device 15 may present an enlargement 19 at its end facing away from the docking device 10. Thus, the locking arms 38a, 38b can be spread by displacing the spreading device 15 in the axial direction 21 of the docking device 10. This simultaneously shifts the enlargement 19 of the spreading device 15 so that the enlargement 19 causes a spreading of the locking arms 38a, 38b.

Figure 2:
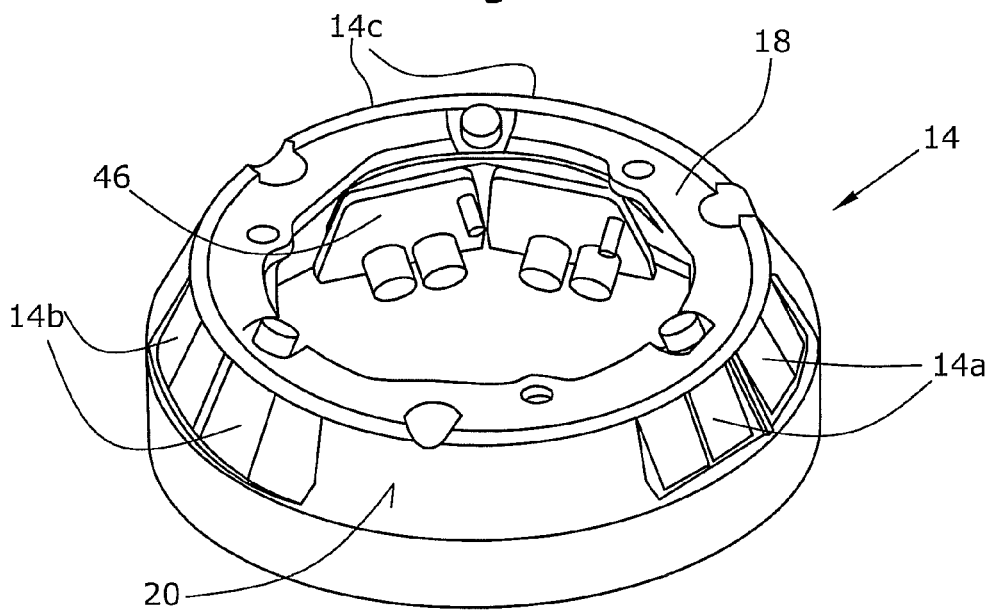
FIG. 2 is a schematic illustration of a distance sensor.

The distance sensor 14 is configured as a capacitive distance sensor having three capacitive sensor modules 14a, 14b, 14c mounted equidistantly on the outer side of an annular holder device 18 (see FIG. 2). The holder device 19 is configured as a circular ring-shaped truncated cone, the sensor modules 14a, 14b, 14c being arranged on the outer side of the shell surface 20 of the annular truncated cone 18 under an acute angle with respect to the base surface of the truncated cone. This angle may be variable for adaptation to different nozzle geometries.

Figure 3:
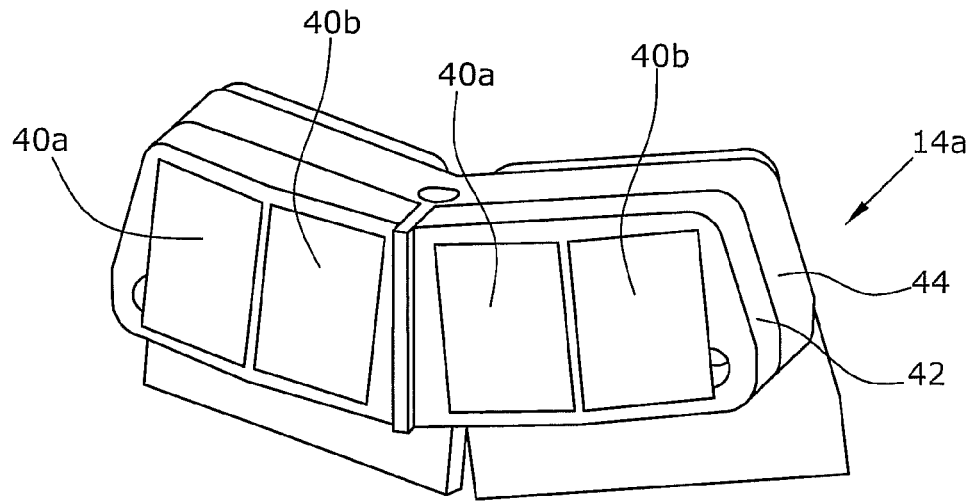
FIG. 3 is a schematic illustration of a capacitive sensor module.

FIG. 3 schematically illustrates the mechanical structure of a sensor module 14a. For measuring the distance from a metal object, for instance the nozzle 12, two capacitor plates 40a, 40b arranged side by side are used that are arranged on an insulating body 42 and are coated with an insulating layer. To allow for a redundant sensor structure and to still be able to use the restricted space to the optimum, two pairs of juxtaposed capacitor plates 40a, 40b are combined into a sensor module 14a. A sensor module 14a thus has one or more sensor surfaces that each carry the two metal capacitor plates 40a, 40b and are each sitting on an insulating body 42. Both the sensor surfaces and the capacitor plates 40a, 40b can be arranged under an angle with respect to each other, so that an adaptation to the circular ring-shaped design of the holder device is facilitated. The insulating body 44 is provided on a metal support 44, on whose rear face, i.e. facing towards the interior of the annular holder device 18, one or two circuit boards 46 with the evaluating electronics are applied directly.

Preferably, at least three of the sensor modules 14a, 14b, 14c are comprised into one annular holder device 18 that is realized as a truncated cone. The inclination of the truncated cone is chosen such that it corresponds to the average value of the inclination of the docking nozzles 12 at the location where the locking is effected.

The compact arrangement ensures both a good thermal coupling between the components—which is important for temperature compensation—and low-noise electrical signals. Further, this ring preferably includes the temperature sensor (s) supplying temperature signal needed for compensation.

The sensor modules 14a, 14b, 14c can be built and tested individually before being integrated into the holder device 18. After they have been fitted, the sensor modules 14a, 14b, 14c are preferably encapsulated. The insulating layer thus formed over the capacitor plates 40a, 40b is preferably at least 1 mm thick and provides sufficient protection from electrostatic discharge.

In order to detect the optimum locking position in the nozzle, here sensor modules 14a, 14b, 14c are preferably provided that are offset by 120° with respect to each other. Locking can be triggered if all three sensor modules 14a, 14b, 14c detect the required distance. If redundancy is required, the described double embodiment is chosen where only the nominal or the redundant unit has to be active. As an alternative, it is also possible to detect the optimum locking position by means of two opposite sensor modules 14a, 14b. The structure described can ensure that a locking of the locking device 16 occurs behind the constriction 13 of the nozzle 12 and the target satellite can be engaged securely.

Figure 4:
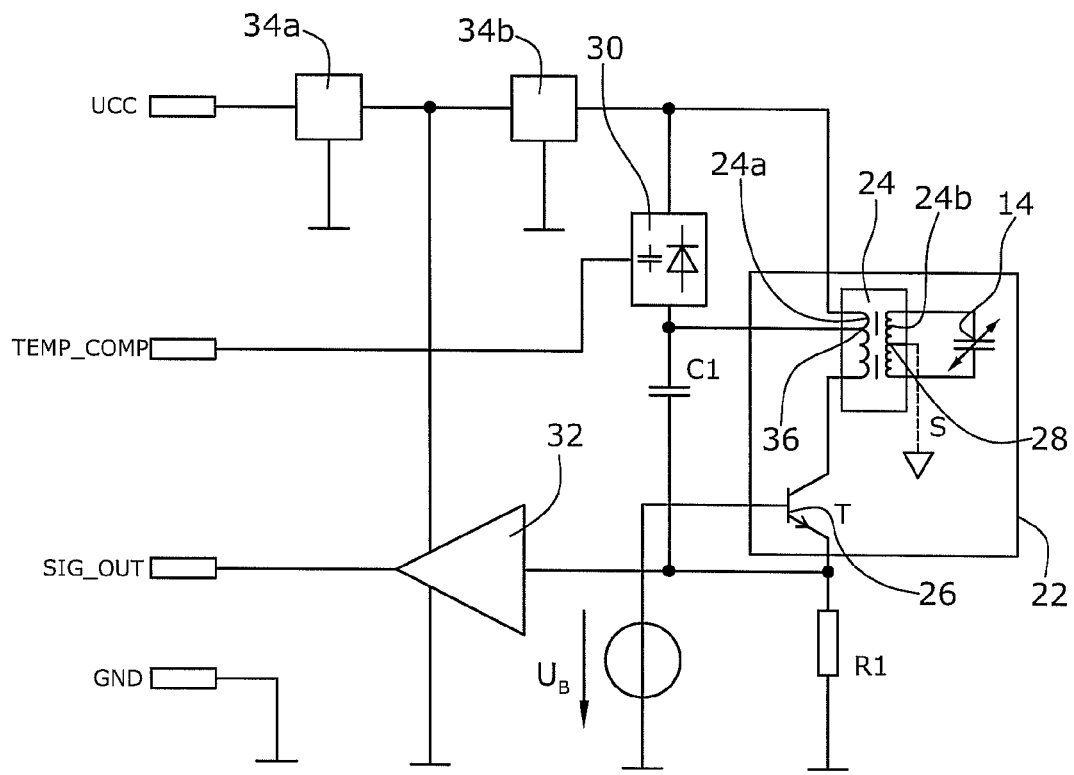
FIG. 4 is a circuit diagram of an exemplary structure of the oscillator circuit of the invention.

A possible structure of an oscillator circuit will be described in detail hereinafter with reference to FIG. 4. The embodiment described here only illustrates one capacitive sensor module 14a, while it is also possible to use a plurality of capacitive sensor modules 14a, 14b, 14c as described for the above mentioned embodiments.

An oscillator 22 is provided that comprises a capacitive distance sensor 14 and an inductor 24 which are connected to form an electric oscillating circuit. Further, an energy supply device 26 in the form of a transistor is provided for supplying electric energy to the electric oscillating circuit. The inductor 24 has a primary winding 24a, as well as a secondary winding 24b wound on the same coil body. The secondary winding 24b has more turns than the primary winding 24a. The capacitive sensor module 14a is integrated in a transformer-like manner into the oscillator 22 via the primary winding 24a and the secondary winding 24b. The oscillator is configured as a Hartley oscillator. The oscillator frequency depends on the capacitance of the capacitive distance sensor 14. This capacitance in turn depends on the sensor's distance from the inner wall 17 of the nozzle 12. The transistor 26 may be embodied as a bipolar transistor or as a J-FET transistor. A bias voltage $U_B$ is required when bipolar transistors are used, with J-FETs this voltage is typically 0 since they are self-conductive.

Preferably, a capacitance diode 30 is provided to achieve an additional detuning of the oscillator 22 by a temperature-dependent voltage supplied from outside, and to thus compensate for a temperature drift.

Moreover, an amplifier element in form of a transistor connected as a voltage follower 32 can be provided for outputting an output signal. Further this circuit may comprise two filters 34a, 34b.

The inductor 24 is used as a transformer. Therefore, despite the air gap provided for storing magnetic energy, a very good magnetic coupling must be ensured between the primary winding 24a and the secondary winding 24b. This can be achieved by building the coil on an integral coil body. The first layer is preferably formed by the first half of the secondary winding (20 turns, for instance) up to an optional central tap and is wound as a single layer, if possible, to keep the coil capacitance small. Depending on the demands regarding the insulation voltage, an additional insulating layer may be applied thereon. Then, an optional screen layer is provided that is made of metal film and is electrically coupled to the circuit or housing ground. Again, an additional insulation may be necessary. In the middle of the layer structure, the primary winding (for instance 4 or 5 turns) is preferably positioned with a tap after a few turns (for instance 1 or 2 turns) for the excitation of the Hartley oscillator, and the separate winding for temperature compensation (1 or 2 turns) is possibly provided there, too. Temperature compensation can be effected by measuring the temperature and driving a capacitance diode with a signal obtained from the temperature. The capacitance diode may also be connected to the main coil or to the tap for exciting the oscillator circuit by positive feedback or to a separate coil.

Possibly, another insulating layer follows. Preferably, another screen layer with an option insulation is then applied. The second half of the secondary winding (for instance 20 turns) preferably lies on top, especially with an insulating layer applied thereon.

The invention claimed is:

1. Docking device for the docking of a maintenance device to a nozzle of a satellite, comprising:
    a distance sensor for determining the distance between the maintenance device and the nozzle of the satellite, and
    a locking device for connecting the docking device with the nozzle of the satellite,
wherein the distance sensor is designed as a capacitive distance sensor wherein the capacitive distance sensor comprises at least one capacitive sensor module,
wherein the at least one capacitive sensor module is mounted on the outer side of an annular holding device,
wherein the annular holding device is designed as an annular truncated cone, and wherein the at least one capacitive sensor module is arranged on the outer side of the shell surface of the annular truncated cone.

2. Docking device of claim 1, wherein the capacitive distance sensor comprises an oscillator, said oscillator comprising:
    a capacitive sensor module and an inductor connected to form an electric oscillating circuit, and
    an energy supply device for supplying electric energy to the electric oscillating circuit.

3. Docking device of claim 2, wherein the inductor has a primary winding and a secondary winding.

4. Docking device of claim 3, wherein the primary winding and the secondary winding are galvanically separated from each other, and the secondary winding is electrically connected with the capacitive sensor module.

5. Docking device of claim 2, wherein the oscillator is configured as a Hartley oscillator.

6. Docking device of claim 3, wherein the secondary winding has a central tap connected to a ground terminal.

7. Docking device of claim 3, wherein the secondary winding comprises more turns than the primary winding.

8. Docking device of claim 2, wherein the oscillator is connected with a capacitance diode for tuning the oscillator.

9. Docking device of claim 8, wherein the oscillator can be fed a temperature-dependent voltage via the capacitance diode.

10. Docking device of claim 2, wherein an amplifier element for an amplification of the output signal of the oscillator.

11. Docking device of claim 10, wherein the amplifier element is configured as a transistor.

12. Docking device of claim 2, wherein the energy supply device is configured as a transistor.

13. Docking device of claim 2, wherein the oscillator is connected with at least one filter device.

14. Docking device of claim 2, wherein the inductor comprises a core material with low magnetic reversal losses that is suited for use in the high frequency range.

15. Docking device of claim 2, wherein the inductor comprises an air gap for storing magnetic energy.

16. Docking device of claim 2, wherein the inductor comprises a pot core.

17. Docking device of claim 15, wherein the air gap is provided within the pot core.

18. Docking device of claim 3, wherein the primary winding and the secondary winding are wound on the same coil body.

19. Docking device of claim 3, wherein the primary winding comprises a tap.

20. Docking device of claim 1, wherein the sensing distance of the capacitive distance sensor is adjustable.

21. Docking device of claim 1, wherein the locking device comprises locking arms for engaging behind a constriction of the nozzle, wherein the locking arms are configured to engage behind the constriction of the nozzle according to a signal by the distance sensor.

22. Docking device of claim 21, wherein the locking device comprises a spreading device for spreading the locking arms.

23. Docking device of claim 22, wherein the spreading device is provided between the locking arms.

24. Docking device of claim 21, wherein, at their ends averted from the docking device, the locking arms are bent and/or kinked outward towards the inner wall of the nozzle.

25. Docking device of claim 22, wherein the spreading device has an enlargement at its end averted from the docking device, the enlargement serving to spread the locking arms.

26. Docking device of claim 25, wherein the spreading device is displaceable in the axial direction of the docking device such that by a displacement of the spreading device towards the docking device, a spreading of the locking arms is effected that is caused by the enlargement.

* * * * *